US005780318A

United States Patent [19]

Hirano et al.

[11] Patent Number: 5,780,318

[45] Date of Patent: Jul. 14, 1998

[54] COLD ELECTRON EMITTING DEVICE AND METHOD OF MANUFACTURING SAME

[75] Inventors: Takayuki Hirano, Tokyo; Junji Itoh; Seigo Kanemaru, both of Tsukuba, all of Japan

[73] Assignees: Kobe Steel, Ltd., Kobe; Director General Agency of Industrial Science and Technology, Tokyo, both of Japan

[21] Appl. No.: 701,866

[22] Filed: Aug. 23, 1996

[30] Foreign Application Priority Data

Aug. 25, 1995 [JP] Japan .................................... 7-217071

[51] Int. Cl.[6] ........................... H01L 21/28; H01L 29/06; H01J 1/30

[52] U.S. Cl. ................................ 438/20; 257/10; 445/50; 313/309; 313/336

[58] Field of Search ...................... 438/20; 313/306-309, 313/336; 445/24, 50, 51; 257/10

[56] References Cited

U.S. PATENT DOCUMENTS

| | | | |
|---|---|---|---|
| 5,212,426 | 5/1993 | Kane | 313/309 |
| 5,256,888 | 10/1993 | Kane | 313/309 |
| 5,268,648 | 12/1993 | Calcatera | 313/309 |
| 5,318,918 | 6/1994 | Frazier | 445/50 |
| 5,359,256 | 10/1994 | Gray | 313/309 |
| 5,521,461 | 5/1996 | Garcia | 445/24 |
| 5,572,041 | 11/1996 | Betsui et al. | 445/50 |

FOREIGN PATENT DOCUMENTS

| | | |
|---|---|---|
| 6-176686 | 6/1994 | Japan . |
| 7-130281 | 5/1995 | Japan . |
| 8-87957 | 4/1996 | Japan . |

OTHER PUBLICATIONS

K. Yokoo et al., J. Vac. Sci. Technol. B 13(2)(1995)491 "Active control of the emission current of FEA's", Mar. 1995.

G. Hashiguchi et al., Jpn. J. Appl. Phys. 35(1B)(1996) L84 "Monolithic Fabrication . . . Field Emitter and Thin Film Transistor", Jan 1996.

*Primary Examiner*—Charles L. Bowers, Jr.
*Assistant Examiner*—Leon Radomsky
*Attorney, Agent, or Firm*—Hazel & Thomas

[57] ABSTRACT

A cold electron emitting device has an emitter base portion, an emitter projection portion and a source region, each of which is an n-type semiconductor, formed on a p-type silicon substrate. A metal film which serves as an extraction electrode and a gate electrode of FET is formed via an insulating layer on the region of the substrate which includes the peripheral regions of the emitter base portion and source region. This cold electron emitting device can be manufactured as follows. First, a conical emitter having an emitter projection portion and emitter base portion and a source region are formed on a p-type semiconductor substrate. Next, an insulating layer and a metal film, which becomes an extraction electrode and a gate electrode of FET, is formed on the substrate which includes peripheral regions of the emitter base portion and source region. Then, an n-type impurity is doped in the emitter and the source region to form an n-type emitter and an n-type source region. In this manner, it is possible to manufacture a cold electron emitting device, which has an excellent work precision for the sharp tip of the emitter projection portion and an excellent uniform structure and can stably emit a current.

10 Claims, 5 Drawing Sheets

COLD ELECTRON EMITTING DEVICE AND METHOD OF MANUFACTURING SAME

BACKGROUND OF THE INVENTION

1. Field of the Invention

The present invention relates to a high-performance cold electron emitting device which is expected to be adapted to electronic apparatuses, such as image display devices like a flat panel display, electron microscopes, electron beam exposing apparatuses, ultra fast electronic devices and various kinds of sensors, and provides a stable emission current, and a method of manufacturing the same.

2. Description of the Related Art

Minute electron emitting devices of field emission type are expected to be adapted to electric apparatuses, such as an image display device, an electron microscope and an electron beam exposing apparatus. Reported conventional electron emitting devices use single crystalline silicon (K. Betsui, Technical Digest of 4th Int. Vacuum Microelectronics Conference, Nagahama, Japan, 1991, p. 26).

FIG. 1 is an exemplary cross-sectional view showing a cold electron emitting device which uses single crystalline silicon. As shown in FIG. 1, a conical (cone-shaped) emitter projection portion 54 having a height of several micrometers is formed at an emitter base portion 51 formed of a single crystalline silicon substrate. Formed on the single crystalline silicon substrate are an insulating layer 52 and an extraction electrode 53, which have openings with diameters of several micrometers formed so as to surround the emitter projection portion 54.

When a voltage of about several tens of volts is applied to the extraction electrode 53 of the thus constituted cold electron emitting device, an intense electric field of $10^7$ V/cm or greater is induced at the sharp tip 54*c* of the emitter projection portion 54. Consequently, electrons $e^-$ are emitted in the direction perpendicular to the emitter base portion 51 from the sharp tip 54*c* of the emitter projection portion 54 by the quantum mechanics tunnel phenomenon.

This conical emitter projection portion 54 is formed of a single crystalline silicon substrate by a combined process of dry etching and thermal oxidization and its sharp tip 54*c* can be so sharpened that the radius of curvature becomes approximately 5 nm. The use of a single crystalline substrate can improve the work precision in structural dimensions and can allow a conical emitter with excellent reproducibility to be formed. In this respect, the conical emitter formed of a single crystalline substrate is superior to a spindt type emitter which is formed by the vacuum deposition of metal.

It has been proposed to connect a resistor to each spindt type emitter in series to stabilize the emission current (R. Meyer, Technical Digest of 4th Int. Vacuum Microelectronics Conference, Nagahama, Japan, 1991, p. 6).

FIG. 2 is an exemplary cross-sectional view showing a cold electron emitting device which has a resistor connected in series to a spindt type emitter. As shown in FIG. 2, a resistive layer 66 is formed on the surface of a conductive substrate 68, and a spindt type emitter 64 is formed on the resistive layer 66 by vacuum deposition of metal such as molybdenum. An insulating layer 62 and an extraction electrode 63, which have openings so formed to surround the emitter 64, are formed on the resistive layer 66, as per the cold electron emitting device shown in FIG. 1.

As the resistive layer 66 is connected as a series resistor to the thus formed emitter 64, a voltage drop occurs at the resistive layer 66 when a current flows through the emitter 64. This brings about such an advantage that when the emitter current increases, the voltage between the emitter 64 and the extraction electrode 63 drops, whereas when the emitter current decreases, the voltage between the emitter 64 and the extraction electrode increases, thus stabilizing the current.

Another propose has been made to use a field effect transistor (FET) in place of a resistor to further stabilize the emission current (A. Ting, et al., Technical Digest of 4th Int. Vacuum Microelectronics Conference, Nagahama, Japan 1991, P200; K. Yokoo, et al., Technical Digest of 7th Int. Vacuum Microelectronics Conference, Grenoble, France, 1994, p. 58). FIG. 3 is an exemplary cross-sectional view showing a substrate which has a current control section and an electron emitting device section which are comprised of FETs. As shown in FIG. 3, at least two n-type semiconductor regions 77*a* and 77*b* are formed on a p-type semiconductor substrate 78. An emitter projection portion 74, an insulating layer 72 having an opening so formed as to surround this emitter projection portion 74, and an extraction electrode 73 located on the insulating layer 72 are formed within the n-type semiconductor region 77*a*, thus constituting an electron emitting device section 79. A drain electrode 76 is formed in a contact hole provided in the insulating layer 72 in the vicinity of the emitter projection portion 74 and contacts the n-type semiconductor region 77*a*. An insulating layer 72*a* is formed on the p-type substrate 78 which includes parts of the n-type semiconductor regions 77*a* and 77*b*, and a gate electrode 75 is formed on the insulating layer 72*a*. A source electrode 71 is formed in a contact hole in the insulating layer 72 formed on the n-type semiconductor region 77*b*. The aforementioned elements constitute an FET which serves as the current control section.

According to the thus constituted substrate, when a positive voltage is applied to the gate electrode 75, an n-type channel is formed at the surface of the p-type semiconductor substrate 78 under the insulating layer 72*a*, causing a current to flow between the source electrode 71 and the drain electrode 76. As a result, a current flows through the emitter 74 and the emission current is controlled by adjusting the applied voltage to the gate electrode 75. By setting the drain current of the FET sufficiently smaller than the emission current, it is therefore possible to emit electrons more stably as compared with the cold electron emitting device shown in FIG. 2 which has a resistor connected to the emitter.

While the device shown in FIG. 1 which uses single crystalline silicon for the emitter can provide an emitter projection portion with excellent reproducibility, it has taken no measure to improve the current stabilization. The device which uses field emission electrons in vacuum has such a shortcoming that on the principle, the current is apt to become unstable due to the motion of molecules adsorbed to the emitter surface in vacuum.

The device shown in FIG. 2 which has a resistor connected to the emitter and has been proposed to overcome the above problem utilizes a voltage drop caused by the series resistor, so that a variation in the emission current from the emitter can be reduced by increasing the resistance of the series resistor. This scheme is not substantially designed to stabilize the emission current and its effect is limited accordingly.

While it is expected that the device shown in FIG. 3 which has an FET connected to the emitter exhibits a prominent effect of stabilizing the emission current by using the stable drain current of the FET, the fabrication process of connecting the FET to the emitter inevitably increases the number of steps of forming the emitter, thus reducing the product yield. As an FET to be connected to each emitter is formed apart therefrom in the substrate surface, the connection of this FET increases the required area for a single emitter, which stands in the way of integrating the emitters.

SUMMARY OF THE INVENTION

Accordingly, it is an object of the present invention to provide a cold electron emitting device which has an excellent work precision for the sharp tip of the emitter projection portion and an excellent uniform structure and can stably emit a current, and a method of manufacturing the same.

A cold electron emitting device according to this invention comprises: a semiconductor substrate of p-type conductivity; an emitter of n-type conductivity having a base portion formed on a surface of said substrate and a projection portion protruding from said base portion, said projection portion having at least one sharp tip; a source region of said n-type conductivity formed on said surface of said substrate; an insulating layer selectively formed on the region of said substrate which excludes the center regions of said base portion and said source region and includes the peripheral regions of said base portion and said source region; and an extraction electrode, formed on said insulating layer, for emitting electrons from said projection portion of said emitter in accordance with a voltage between said extraction electrode and said emitter.

A plurality of source regions and a plurality of extraction electrodes may be formed in a stripe pattern in such a way as to be perpendicular to one another, and the emitter may be located at an intersection of each source region and an associated one of the extraction electrodes in a plane and is surrounded by the source region, so that applying a predetermined voltage to a specific source region and an associated one of the extraction electrodes enables only that emitter which is located at an intersection of the specific source region and the associated extraction electrode in a plane.

A source electrode of a metal or a compound thereof may be formed on the source region.

Further, the projection portion of the emitter may be formed of single crystalline silicon or a metal.

It is preferable that the substrate be a p-type semiconductor substrate having a conductivity with a resistivity of 10 ω-cm or greater.

A method of manufacturing a cold electron emitting device according to this invention comprises the steps of forming an emitter having a base portion and a projection portion with a sharp tip on a surface of a semiconductor substrate of p-type; forming a source region on said substrate; selectively forming an insulating layer on the region of said substrate which excludes the center regions of said base portion and said source region and includes the peripheral regions of said base portion and said source region; forming an extraction electrode on said insulating layer; and doping an impurity of the other conductivity type in said base portion of said emitter and said source region.

The present inventor has done intense studies on the above-discussed problems and found that the emission current can be stabilized by incorporating the FET function in the electron emitting device itself. Specifically, a prominent effect of suppressing a variation in emission current can be acquired by limiting electrons in a solid which are supplied to the emitter by the FET function.

According to this invention, p-type silicon is used for the substrate, an emitter having a base portion and a projection portion both of an n-type semiconductor are formed on this substrate, and an extraction electrode is formed on an insulating layer between the emitter and the source region. Accordingly, the extraction electrode which has been provided to apply an intense electric field to the sharp tip of the emitter projection portion to thereby extract electrons from the emitter also serves as a gate electrode for controlling the amount of the current flowing through the emitter base portion and projection portion. In other words, when a positive voltage is applied to the extraction electrode to extract electrons from the sharp tip of the emitter projection portion, this positive voltage forms an inversion layer (n-channel) in the surface of the p-type silicon substrate under the extraction electrode. This n-channel allows the emitter base portion and projection portion to be electrically connected to the source electrode to stably supply the current to the emitter projection portion. Therefore, the extraction electrode serves as both the extraction electrode and the gate electrode of FET. Accordingly, another electrode than the extraction electrode serving as the FET gate electrode (electrode 73 in the prior art shown in FIG. 3) is unnecessary in the present invention.

An MOS (Metal Oxide Semiconductor) has been formed at the portion of the extraction electrode. Therefore, the same advantage can be acquired on the same principle as in the case where the MOS-FET is connected to the emitter, so that the emission current can be controlled. Because the number of electrons emitted from the tip of the emitter by the quantum mechanics tunnel phenomenon is limited by the amount of electrons flowing through the n-channel induced at the surface of the p-type substrate by the extraction electrode. Like the prior art shown in FIG. 3, this invention has a significant effect of providing a stable emission current. Since the extraction electrode also serves as the FET gate electrode in this invention, unlike the prior art in FIG. 3, this invention can provide a high-performance cold electron emitting device with a very simple structure, which reduces required area for a single emitter.

According to this invention, as apparent from the above, p-type silicon is used for the substrate, the emitter base portion and source region at the surface of the substrate are doped to an n-type and the FET function is incorporated in the cold electron emitting device itself, the integration of emitters becomes easier and this cold electron emitting device can stably emit electrons. If the emitter is formed of single crystalline silicon, a cold electron emitting device with a high work precision in structural dimensions can be acquired. According to the present method, a cold electron emitting device can be manufactured by adding only one step of doping an n-type impurity to both the source region and the emitting base region, the manufacture of the device becomes easier than that of the prior art shown in FIG. 3.

DETAILED DESCRIPTION OF THE PREFERRED EMBODIMENTS

Preferred embodiments of the present invention will now be described with reference to the accompanying drawings. FIGS. 4A through 4F present exemplary cross-sectional views showing a step-by-step method of manufacturing a cold electron emitting device according to the first embodiment of this invention.

Figure 1:
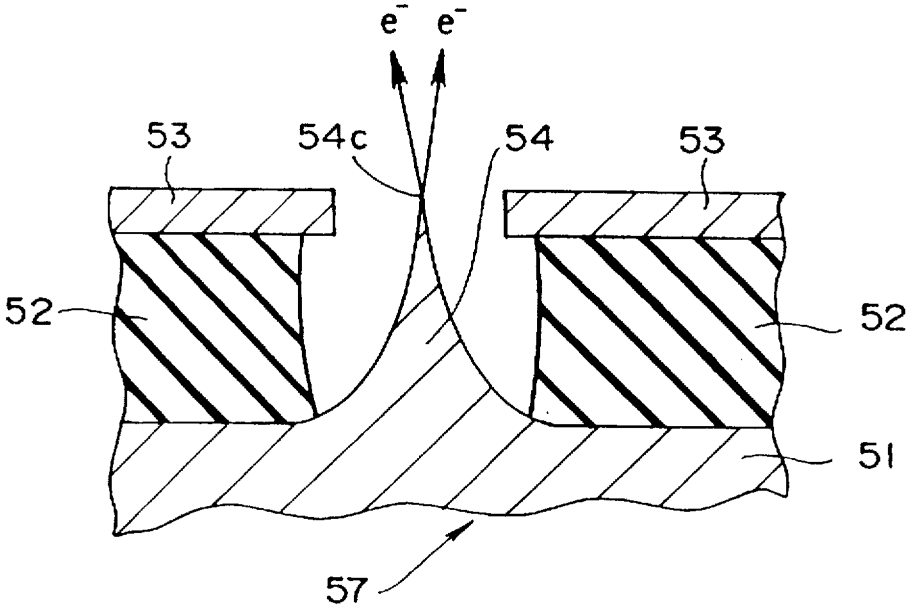
FIG. 1 ( Prior Art )
FIG. 1 is an exemplary cross-sectional view showing a conventional cold electron emitting device which uses single crystalline silicon.
Figure 2:
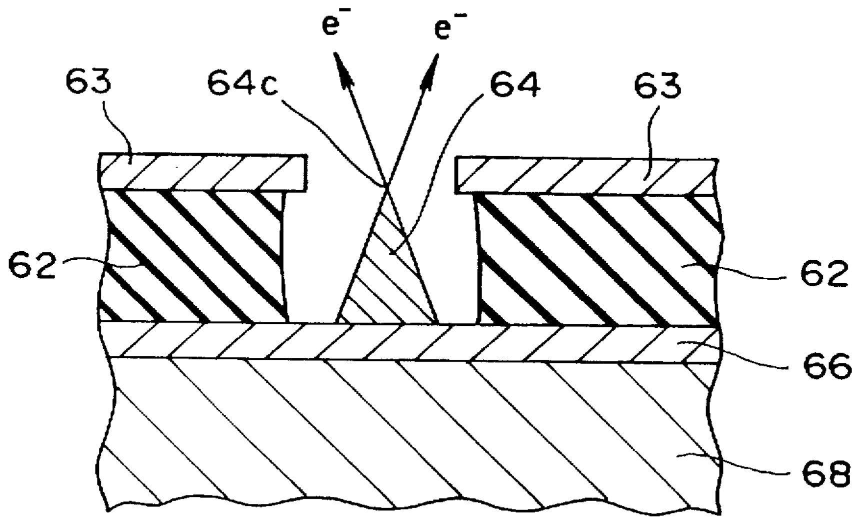
FIG. 2 ( Prior Art )
FIG. 2 is an exemplary cross-sectional view showing a cold electron emitting device which has a resistor connected in series to a spindt type emitter.
Figure 3:
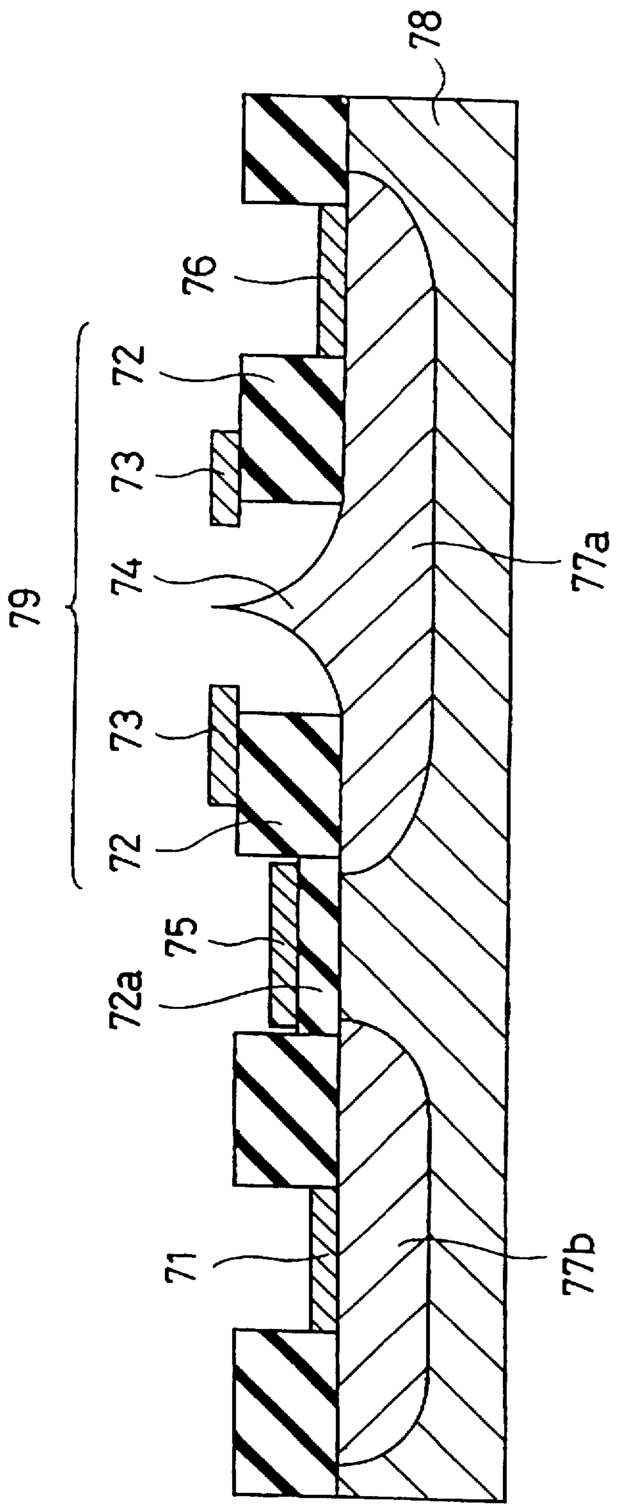
FIG. 3 (Prior Art)
FIG. 3 is an exemplary cross-sectional view showing a cold electron emitting device which is electrically connected with a current control section such as FET.
Figure 4A:
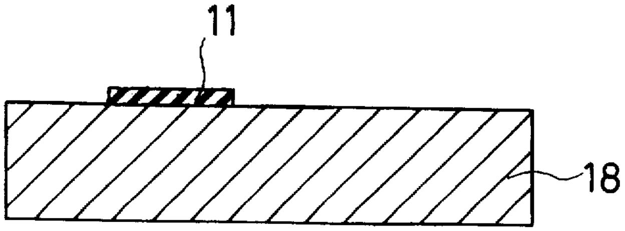
FIGS. 4A through 4F are exemplary cross-sectional views showing a step-by-step method of manufacturing a cold electron emitting device according to the first embodiment of this invention.

First, as shown in FIG. 4A, the surface of a p-type silicon substrate 18 is thermally oxidized to form a silicon oxide film which is then subjected to photolithography and wet etching to form a disk-shaped silicon oxide film 11.

Figure 4B:
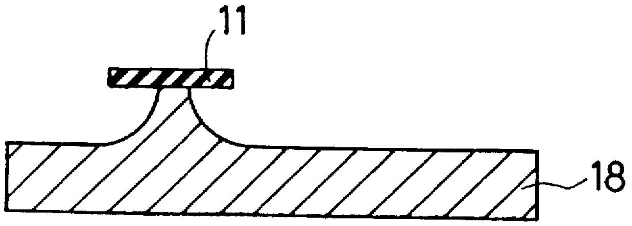

Next, as shown in FIG. 4B, the p-type silicon substrate 18 is subjected to dry etching with the disk-shaped silicon oxide film 11 as a mask to shape a part of the surface of the p-type silicon substrate 18 under the silicon oxide film 11 in an emitter outline.

Figure 4C:
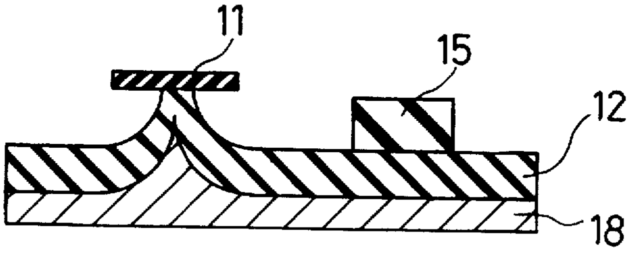

Then, to sharpen the tip of the emitter outline, the surface of the p-type silicon substrate 18 is thermally oxidized to form an oxide film 12, as shown in FIG. 4C. At this time, to form openings of the electrode in the insulating layer, a photoresist 15 is patterned on the oxide film 12 where a source region is to be formed.

Figure 4D:
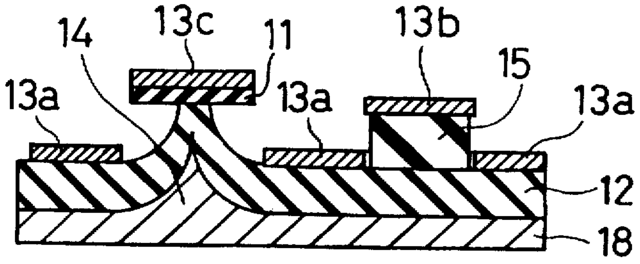

Next, as shown in FIG. 4D, metal films **13*c*, 13*a* and 13*b* are respectively vapor-deposited on the disk-shaped silicon oxide film 11, the oxide film 12 and the photoresist 15**.

Figure 4E:
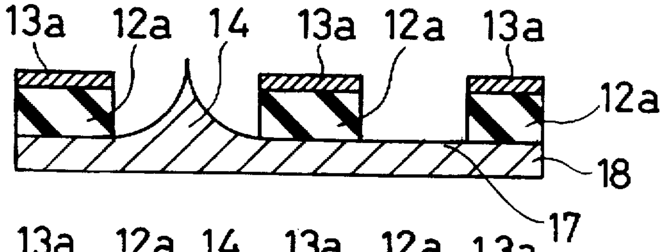

Then, as shown in FIG. 4E, the photoresist 15 is removed by using a resist removing liquid and the metal film **13*b* on the photoresist 15 is removed by the lift-off method. Thereafter, the device is treated with hydrofluoric solution or the like. Consequently, with the metal film 13*a* as a mask, the portion of the silicon oxide film 12 which is not covered with this metal film 13*a* is selectively removed. At this time, the disk-shaped silicon oxide film 11 and the silicon oxide film 12 under the oxide film 11 contact the hydrofluoric solution or the like to be removed, thus yielding a conical emitter projection portion 14. Accordingly, the oxide film 12 remaining on the substrate 18 becomes an insulating layer 12*a***.

Figure 4F:
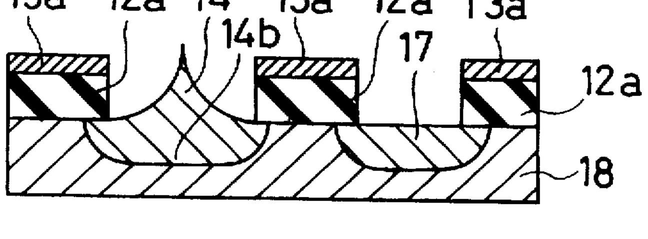

Thereafter, as shown in FIG. 4F, ions of an n-type impurity are implanted using the metal film **13*a* and the insulating layer 12*a* as masks to form an n-type emitter projection portion 14, an n-type emitter base portion 14*b* and a source region 17**. Through the above procedures, a cold electron emitting device is completed.

Figure 5:
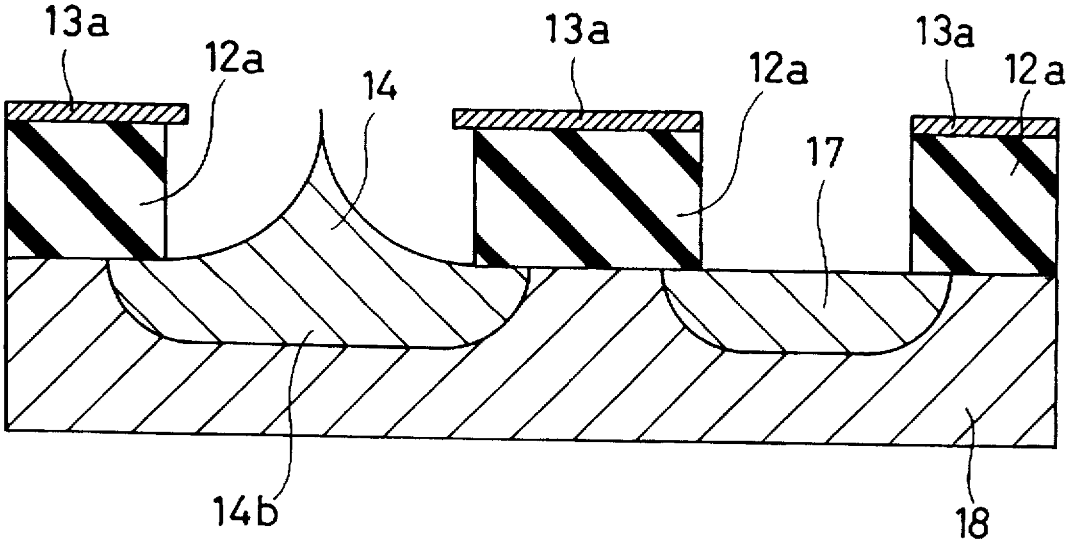
FIG. 5 is an exemplary cross-sectional view showing the structure of the cold electron emitting device according to the first embodiment of this invention.

FIG. 5 is an exemplary cross-sectional view showing the structure of the cold electron emitting device according to the first embodiment. As mentioned above, the emitter base portion **14*b* and projection portion 14 both of an n-type semiconductor and the source region 17 are formed, apart from each other, on the surface of the p-type silicon substrate 18. Actually, multiple emitter base portions 14*b* and emitter projection portions 14 and multiple source regions 17 are alternately and continuously formed on the surface of the substrate 18. The insulating layer 12*a* is formed on the region of the substrate 18 which excludes the center region of the emitter base portions 14*b* and the source regions 17, but includes the peripheral regions of the emitter base portions 14*b* and the source regions 17. The metal film 13*a* which serves as the extraction electrode and gate electrode is formed on this insulating layer 12*a***.

When a positive voltage is applied to the metal film **13*a* in the thus constituted cold electron emitting device according to the first embodiment, a voltage is also applied to the p-type silicon substrate 18 which faces the metal film 13*a* via the insulating layer 12*a*. Consequently, an n-type inversion layer is formed in the surface of the p-type silicon substrate 18 under the insulating layer 12*a*, so that an n-channel with a small resistance is formed only in this portion. Therefore, the emitter base portion 14*b* and emitter projection portion 14 are electrically connected to the source region 17 via this n type inversion layer, allowing the emission current to be supplied to the emitter projection portion 14. By controlling the applied voltage to the metal film 13*a*, therefore, a stable current is supplied to the emitter projection portion 14 from the source region 17**.

Figure 6:
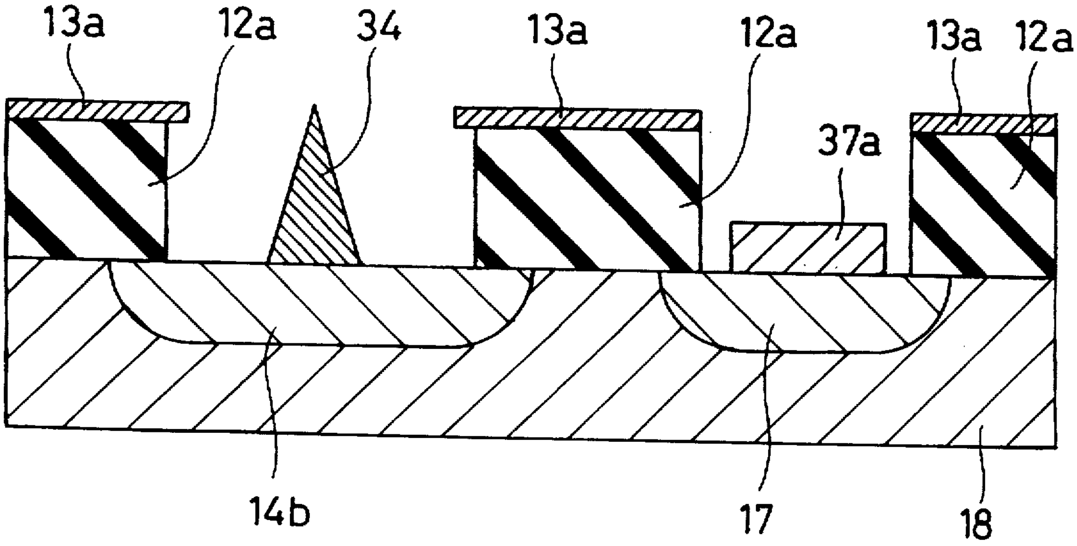
FIG. 6 is an exemplary cross-sectional view showing a cold electron emitting device according to the second embodiment of this invention.

FIG. 6 is an exemplary cross-sectional view showing a cold electron emitting device according to the second embodiment of this invention. This embodiment differs from the first embodiment illustrated in FIG. 5 in that an emitter projection portion 34 is formed of a metal such as molybdenum, not an n-type semiconductor, and a source electrode **37*a* of a metal or a compound thereof is formed on the source region 17 shown in FIG. 5, and the other structure is the same as that of the embodiment shown in FIG. 5. To avoid the redundant description, therefore, like or same reference numerals are given to those components in FIG. 6 which are the same as the corresponding components in FIG. 5**.

Because the current to the emitter projection portion 34 even in the cold electron emitting device whose source electrode is formed of a metal can be controlled by the same effect as used in the first embodiment. If a Schottky junction is formed between the source region 17 and the source electrode **37*a* as shown in FIG. 6**, the same advantage can be acquired without an n-type source region.

Figure 7:
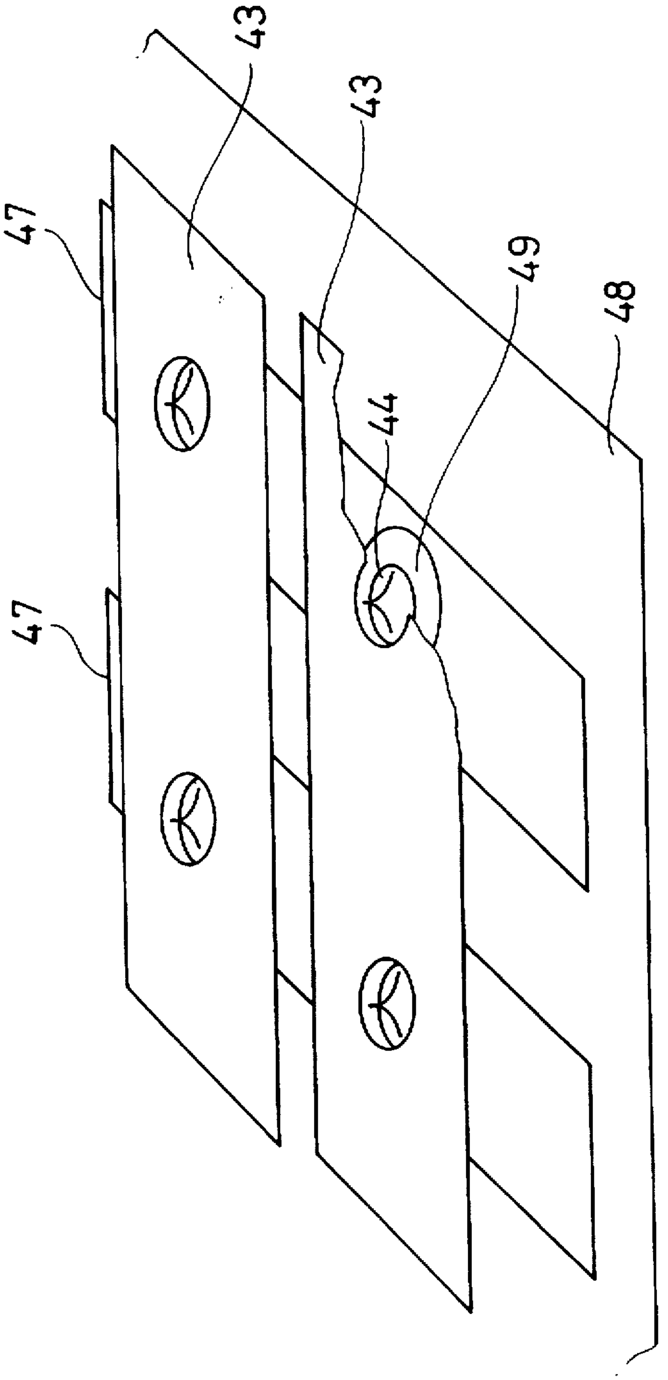
FIG. 7 is a perspective view of the third embodiment of this invention which has multiple cold electron emitting devices arranged in an array.

FIG. 7 is a perspective view showing the third embodiment of this invention which has multiple cold electron emitting devices arranged in an array. The structures of the individual devices are the same as that shown in FIG. 5. As shown in FIG. 7, a plurality of source regions 47 of an n type semiconductor in a stripe pattern, which extend in one direction, are formed parallel to one another at the proper intervals on the surface of a p-type semiconductor substrate 48. A plurality of extraction electrodes 43 in a stripe pattern, which extend in the direction perpendicular to the source regions 47 in the stripe pattern are formed parallel to one another at the proper intervals above the source regions 47 via an insulating layer. A plurality of emitters 44 of an n-type semiconductor are located at intersections of the source regions 47 and the extraction electrodes 43 in a plane. Those emitters 44 are formed in such a way as to be located at the centers of ring-shaped p-type regions 49 in the surface of the substrate 48, which are formed in the source regions 47 in the stripe pattern. Each extraction electrode 43 has an opening so formed as to surround the projection portion of the associated emitter 44. A source electrode (not shown) is connected to each source region.

The thus constituted cold electron emitting device can be manufactured by simple manufacturing procedures. The matrix driving of the emitter elements is possible by using the extraction electrodes 43 and the source electrodes (source regions 47) as the switching electrodes for the emitters 44. More specifically, when a predetermined voltage is applied to a specific one of the extraction electrodes 43 in the stripe pattern and a specific one of the source electrodes (source regions 47) which is associated with the specific extraction electrode, only the emitter 44 which is located at the intersection of the voltage-applied extraction electrode and source region in a plane can be operated (matrix driven). Because each emitter 44 is surrounded by the associated source region 47 in this embodiment, it is possible to prevent the occurrence of mutual interference between adjoining devices. The emitter array of a matrix driving type is effective for use in a flat type display or the like.

Although the structural relationship among the emitters 44, the source regions 47 and the extraction electrodes 43 in this embodiment is the same as the one shown in FIG. 5, the manufacturing method differs from the one illustrated in FIGS. 4A through 4F. The manufacturing method shown in FIGS. 4A–4F forms the source regions 17 in the last step, whereas the source regions 47 should be formed prior to the formation of the gate electrodes (extraction electrodes 43) in the embodiment shown in FIG. 7.

What is claimed is:

1. A cold electron emitting device comprising: a semiconductor substrate of a p-type conductivity;
   an emitter having a base portion of an n-type conductivity formed on a surface of said substrate and a projection portion protruding from said base portion, said projection portion having at least one sharp tip;
   a source region of an n-type conductivity formed on said surface of said substrate;
   an insulating layer selectively formed on the region of said substrate which excludes the center regions of said base portion and said source region and includes the peripheral regions of said base portion and said source region; and
   an extraction electrode, formed on said insulating layer, for emitting electrons from said projection portion of said emitter in accordance with a voltage between said extraction electrode and said source region; wherein
   the extraction electrode simultaneously serves as a gate electrode of a field effect transistor to form an inversion layer in said substrate to control the amount of current flowing through the emitter base portion.

2. The cold electron emitting device according to claim 1, wherein a plurality of source regions and a plurality of extraction electrodes are formed in a stripe pattern in such a way as to be perpendicular to each other; and
   said emitter is located at an intersection of each source region and an associated one of said extraction electrodes and is surrounded by said source region;
   whereby applying a predetermined voltage to a specific source region and an associated one of said extraction electrodes enables only that emitter which is located at an intersection of said specific source region and said associated extraction electrode.

3. The cold electron emitting device according to claim 1, comprising a source electrode of a metal or a compound thereof formed on said source region.

4. The cold electron emitting device according to claim 1, wherein said projection portion of said emitter is formed of single crystalline silicon.

5. The cold electron emitting device according to claim 1, wherein said projection portion of said emitter is formed of a metal.

6. The cold electron emitting device according to claim 1, wherein said substrate is a p-type semiconductor substrate with a resistivity of 10 ω-cm or greater.

7. A method of manufacturing a cold electron emitting device comprising the steps of:
   forming an emitter having a base portion and a projection portion with a sharp tip on a surface of a semiconductor substrate of p-type conductivity;
   forming a source region on said substrate;
   selectively forming an insulating layer on the region of said substrate which excludes the center regions of said base portion and said source region and includes the peripheral regions of said base portion and said source region;
   forming an extraction electrode on said insulating layer; and
   doping an impurity of n-type conductivity in said base portion of said emitter and said source region wherein the extraction electrode simultaneously serves as a gate electrode of a field effect transistor to form an inversion layer in said substrate to control the amount of current flowing through the emitter base portion.

8. The method according to claim 7, wherein said projection portion of said emitter is formed of a metal.

9. The method according to claim 7, wherein said projection portion of said emitter is formed of single crystalline silicon.

10. The method according to claim 7, comprising the step of forming a source electrode of a metal or a compound thereof on said source region.

* * * * *